United States Patent [19]

Hosaka et al.

[11] Patent Number: 5,087,548
[45] Date of Patent: Feb. 11, 1992

[54] POSITIVE TYPE RADIATION-SENSITIVE RESIN COMPOSITION

[75] Inventors: Yoshihiro Hosaka, Yokohama; Ikuo Nozue, Yokkaichi; Masashige Takatori, Yokohama; Yoshiyuki Harita, Kawasaki; Kiyoshi Honda, Yokohama, all of Japan

[73] Assignee: Japan Synthetic Rubber Co., Inc., Tokyo, Japan

[21] Appl. No.: 282,958

[22] Filed: Dec. 5, 1988

Related U.S. Application Data

[63] Continuation of Ser. No. 946,056, Dec. 24, 1986, abandoned.

[30] Foreign Application Priority Data

Dec. 27, 1985 [JP] Japan .................. 60-296653
Jan. 27, 1986 [JP] Japan .................. 61-15333

[51] Int. Cl.$^5$ ............................ G03E 7/022
[52] U.S. Cl. ...................... 430/192; 430/193
[58] Field of Search ............ 430/193, 190, 192; 534/556, 557

[56] References Cited

U.S. PATENT DOCUMENTS

| | | | |
|---|---|---|---|
| 3,046,118 | 7/1962 | Schmidt | 430/193 |
| 3,102,809 | 9/1963 | Endermann et al. | 430/193 |
| 3,106,465 | 10/1963 | Nengebauer et al. | 430/193 |
| 3,130,047 | 4/1964 | Uhlig et al. | 430/193 |
| 3,635,709 | 1/1972 | Kobayashi | 430/193 |
| 3,859,099 | 1/1975 | Petropoulos et al. | 430/190 |
| 4,123,279 | 10/1978 | Kobayashi | 430/193 |
| 4,409,314 | 10/1983 | Buha et al. | 430/193 |
| 4,424,270 | 1/1984 | Erdmann et al. | 430/193 |
| 4,439,516 | 3/1984 | Cernigliaro et al. | 430/193 |
| 4,477,553 | 10/1984 | Yamamoto et al. | 430/192 |
| 4,499,171 | 2/1985 | Hosaka et al. | 430/192 |
| 4,529,682 | 7/1985 | Toukhy | 430/192 |
| 4,536,464 | 8/1985 | Nagashima et al. | 430/192 |
| 4,536,465 | 8/1985 | Uchara et al. | 430/192 |
| 4,551,409 | 11/1985 | Gulla et al. | 430/192 |
| 4,626,492 | 12/1980 | Eilbeck | 430/193 |
| 4,650,741 | 3/1987 | Miura et al. | 430/192 |
| 4,719,167 | 1/1988 | Miura et al. | 430/193 |

FOREIGN PATENT DOCUMENTS

| | | |
|---|---|---|
| 21716 | 1/1981 | European Pat. Off. |
| 21718 | 1/1981 | European Pat. Off. |
| 54258 | 6/1982 | European Pat. Off. |
| 110214 | 6/1984 | European Pat. Off. |
| 148787 | 7/1985 | European Pat. Off. |
| 60-164740 | 5/1985 | Japan .................. 430/192 |
| 60-121445 | 6/1985 | Japan .................. 430/193 |
| 61-118744 | 6/1986 | Japan .................. 430/193 |
| 2172117 | 10/1986 | United Kingdom . |

OTHER PUBLICATIONS

Pampalone, T. R., *Solid State Technology*, 6/1984, pp. 115-120.

Ichikawa et al., Chemical Abstracts, vol. 105, #235863j, 1986.
Ichikawa et al., Derwent Abstract of Japanese Kokai Tokyo Koho, #61/118,744.
English Language Abstract of Japanese Publication #59-88735, published 5/1984.
English Language Abstract of Japanese Publication #59-88736, published 5/1984.
English Language Abstract of Japanese Publication #59-84238, published 5/1984.
English Language Abstract of Japanese Publication #59-84239, published 5/1984.

*Primary Examiner*—Charles L. Bowers, Jr.
*Assistant Examiner*—John S. Y. Chu
*Attorney, Agent, or Firm*—Oblon, Spivak, McClelland, Maier & Neustadt

[57] ABSTRACT

A positive type radiation-sensitive resin composition which comprises a 1,2-quinonediazide compound and an alkali-soluble novolac resin produced by poly-condensing phenols represented by the formulas (I) and (II) in a molar ratio of (I)/(II) of 1/99 to 100/0 with a carbonyl compound:

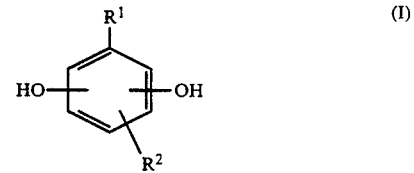

wherein $R^1$ and $R^2$, which may be the same or different, represent hydroxyl groups, hydrogen atoms, alkyl groups, aryl groups, aralkyl groups, alkenyl groups, halogen atoms, alkoxy groups, alkoxycarbonyl groups, aroxycarbonyl groups, alkanoyloxy groups, aroyloxy groups, acyl groups, cyano groups or nitro groups,

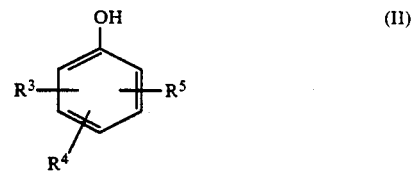

wherein $R^3$, $R^4$ and $R^5$, which may be the same or different, represent hydrogen atoms, alkyl groups, aryl groups, aralkyl groups, alkenyl groups, halogen atoms, alkoxy groups, alkoxycarbonyl groups, aroxycarbonyl groups, alkanoyloxy groups, aroyloxy groups, acyl groups, cyano groups or nitro groups. The above positive type radiation-sensitive resin composition is excellent in dry-etching resistance, resolution and heat resistance, and appropriate as a positive type resist for producing integrated circuits in which a resist pattern is formed, and also as a positive type resist for producing a mask.

1 Claim, No Drawings

POSITIVE TYPE RADIATION-SENSITIVE RESIN COMPOSITION

This application is a Continuation of application Ser. No. 06/946,056, filed on Dec. 24, 1986, now abandoned.

This invention relates to a positive type radiation-sensitive resin composition, and more particularly to a positive type radiation-sensitive resin composition particularly suitable as a resist for producing integrated circuits, which composition is sensitive to radiations such as ultraviolet rays, far-ultraviolet rays, X-rays, electron beams, molecular beams, gamma-rays, synchrotron radiations, proton beams and the like.

The resists which have heretofore been used in the production of integrated circuits include negative type resists comprising a cyclized rubber and a bisazide compound, and positive type resists comprising an alkali-soluble novolac resin and a 1,2-quinonediazide compound. When the negative type resist is irradiated with a light, the bisazide compound liberates a nitrogen to become a nitrene, which three-dimensionally crosslinks the cyclized rubber. However, the light-irradiated portions are not completely cured, and therefore, the resist pattern is greatly swollen in a developing solution consisting of an organic solvent, whereby the resolution of the resist pattern becomes low. This is disadvantageous.

On the other hand, the positive type resist comprises an alkali-soluble novolac resin and an alkali-insoluble 1,2-quinonediazide compound and hence is difficult to dissolve in a developing solution consisting of an aqueous alkaline solution and is hardly swollen. Accordingly, the 1,2-quinonediazide compound contained in the light-irradiated portion is converted into a carboxylic acid. Therefore, when the irradiated resist is developed with a developing solution consisting of an aqueous alkaline solution, the light-unirradated portions which form a resist pattern are very small in solubility change, and therefore, a resist pattern is obtained which is faithful to the mask and has a high resolution. Thus, in recent years during which higher integration of integrated circuits has been required, such positive type resists having an excellent resolution have often been used.

Also, attempts to enhance the resolution of resists have been made by not only improving the characteristics of resists, but also improving the method of producing integrated circuits, for example, changing the wet etching method, which has heretofore been the main current, to a dry etching method.

However, this dry etching method requires etching the substrate with reactive ions. Therefore, the temperature of the substrate rises during the etching, and the resist pattern undergoes thermal deformation to reduce the dimension accuracy. In addition, highly reactive fluorine ions, chlorine ions and the like impair the resist pattern. This is disadvantageous.

Commercially available novolac resin-based positive type resists have heretofore been evaluated to be resistant to such severe dry etching as compared with other resists. However, they cannot be said to be fully satisfactory.

An object of this invention is to provide a positive type radiation-sensitive resin composition having an improved dry etching resistance and also having an improved resolution and thermal resistance.

Other objects and advantages will become apparent from the following description.

According to this invention, there is provided a positive type radiation-sensitive resin composition comprising a 1,2-quinonediazide compound and an alkali-soluble novolac resin produced by polycondensing phenols represented by formulas (I) and (II) in a molar ratio of (I)/(II) of 1/99 to 100/0 with a carbonyl compound (said composition being hereinafter referred to as Composition A):

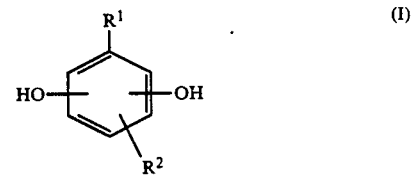

(I)

wherein $R^1$ and $R^2$, which may be the same or different, represent hydroxyl groups, hydrogen atoms, alkyl groups, aryl groups, aralkyl groups, alkenyl groups, halogen atoms, alkoxy groups, alkoxycarbonyl groups represented by —COOR in which R represents an alkyl group similar to $R^1$ and $R^2$ (the same applys hereinafter), aroxycarbonyl groups represented by —COOAr in which Ar represents an aryl group similar to $R^1$ and $R^2$ (the same applys hereinafter), alkanoyloxy groups represented by RCOO—, aroyloxy groups represented by ArCOO—, acyl groups, cyano groups or nitro groups, and preferred are hydroxyl group, hydrogen atom, alkyl group, aryl group, aralkyl group, alkenyl group, halogen atom, alkoxy group, alkoxycarbonyl group and acyl group; and

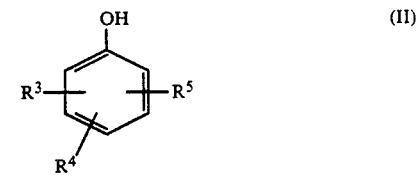

(II)

wherein $R^3$, $R^4$ and $R^5$, which may be the same or different, represent hydrogen atoms, alkyl groups, aryl groups, aralkyl groups, aralkenyl groups, halogen atoms, alkoxy groups, alkoxycarbonyl groups, aroxycarbonyl groups, alkanoyloxy groups, aroyloxy groups, acyl groups, cyano groups or nitro groups, and preferred are hydrogen atom, alkyl group and aryl group.

This invention also provides a positive type radiation-sensitive resin composition comprising 100 parts by weight of an alkali-soluble resin and 5 to 100 parts by weight of a 1,2-quinonediazide compound represented by the formula (III):

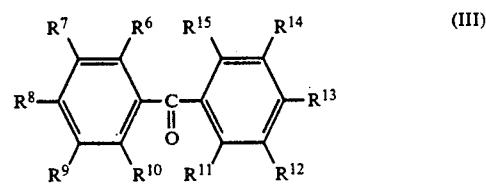

(III)

wherein $R^6$ to $R^{15}$, which may be the same or different, represent hydroxyl groups, 1,2-quinonediazidosulfonyl groups, hydrogen atoms, alkyl groups having 1 to 4 carbon atoms, alkoxy groups having 1 to 4 carbon atoms, halogen atoms, cyano groups, nitro groups, acyl groups having 2 to 5 carbon atoms or aralkyl groups having 7 to 9 carbon atoms; the number (n) of the hydroxyl groups in the formula (III) is 0 or an integer of 1 to 9; the number (m) of the 1,2-quinonediazidosulfonyl groups in the formula (III) is an integer of 1 to 10; and $5 \leq n+m \leq 10$ (said composition being hereinafter referred to as Composition B).

Next, Composition A is explained in detail.

In the definitions of $R^1$, $R^2$, $R^3$, $R^4$ and $R^5$ in the formulas (I) and (II), the alkyl group includes, for example, methyl, ethyl, propyl and butyl; the aryl group includes, for example, phenyl, tolyl and cumenyl; the alkenyl group includes, for example, vinyl, propenyl, allyl and butenyl; the aralkyl group includes, for example, benzyl, phenethyl and phenylpropyl; the halogen atom includes, for example, chlorine, fluorine and bromine; the alkoxy group includes, for example, methoxy, ethoxy, propoxy and butoxy; and the acyl group includes, for example, acetyl, propionyl, butyryl and valeryl.

The phenols represented by the formula (I) used in the Composition A include, for example, pyrogallol, 1,2,3-trihydroxy-5-fluorobenzene, 1,2,3-trihydroxy-5-chlorobenzene, 1,2,3-trihydroxy-5-bromobenzene, 3,4,5-trihydroxydiphenyl, 1,2,3-trihydroxy-5-methylbenzene, 1,2,3-trihydroxy-5-ethylbenzene, 1,2,3-trihydroxy-5-n-propylbenzene, 1,2,3-trihydroxy-5-isopropylbenzene, 1,2,3-trihydroxy-5-n-butylbenzene, 1,2,3-trihydroxy-t-butylbenzene, catechol, 3-methylcatechol, 3-ethylcatechol, 3-isopropylcatechol, 3-t-butylcatechol, 4-methylcatechol, 4-ethylcatechol, 4-isopropylcatechol, 4-t-butylcatechol, 3-acetoxycatechol, 4-acetoxycatechol, 3-fluorocatechol, 4-fluorocatechol, 3-chlorocatechol, 4-chlorocatechol, 3-bromocatechol, 4-bromocatechol, hydroquinone, 2-methylhydroquinone, 2-isopropylhydroquinone, 2-t-butylhydroquinone, 2-acetoxyhydroquinone, 2-phenylhydroquinone, 2-fluorohydroquinone, 2-chlorohydroquinone, 2-bromohydroquinone, phloroglucinol, resorcinol, 5-fluororesorcinol, 5-chlororesorcinol, 5-bromoresorcinol, 5-methylresorcinol, 5-ethylresorcinol, 5-n-propylresorcinol, 5-isopropylresorcinol, 5-n-butylresorcinol, 5-t-butylresorcinol, 3,5-dihydroxybiphenyl, 2-methylphloroglucinol, 2-ethylphloroglucinol, 2-n-propylphloroglucinol, 2-isopropylphloroglucinol, 2-n-butylphloroglucinol, 2-t-butylphloroglucinol, 2-methylresorcinol, 2-ethylresorcinol, 2-n-propylresorcinol, 2-isopropylresorcinol, 2-n-butylresorcinol, 2-t-butylresorcinol, 2-methyl-5-fluororesorcinol, 2-methyl-5-chlororesorcinol, 2-methyl-5-bromoresorcinol, 2-ethyl-5-fluororesorcinol, 2-ethyl-5-chlororesorcinol, 2-ethyl-5-bromoresorcinol, 2-n-propyl-5-fluororesorcinol, 2-n-propyl-5-chlororesorcinol, 2-isopropyl-5-bromoresorcinol, 2-n-butyl-5-fluororesorcinol, 2-n-butyl-5-chlororesorcinol, 2-n-butyl-5-bromoresorcinol, 2-t-butyl-5-fluororesorcinol, 2-t-butyl-5-chlororesorcinol, 2-t-butyl-5-bromoresorcinol, 2,5-dimethylresorcinol, 2-methyl-5-ethylresorcinol, 2-methyl-5-n-propylresorcinol, 2-methyl-5-isopropyl 2-methyl-5-n-butylresorcinol, 2-methyl-5-t-butylresorcinol, 2-ethyl-5-methylresorcinol, 2,5-diethylresorcinol, 2-ethyl-5-n-propylresorcinol, 2-ethyl-5-isopropylresorcinol, 2-ethyl-5-n-butylresorcinol, 2-ethyl-5-t-butylresorcinol, 2-n-propyl-5-methylresorcinol, 2-n-propyl-5-ethylresorcinol, 2,5-di-n-propylresorcinol, 2-n-propyl-5-isopropylresorcinol, 2-n-propyl-5-n-butylresorcinol, 2-n-propyl-5-t-butylresorcinol, 2-isopropyl-5-methylresorcinol, 2-isopropyl-5-ethylresorcinol, 2-isopropyl-5-n-propylresorcinol, 2,5-diisopropylresorcinol, 2-isopropyl-5-n-butylresorcinol, 2-isopropyl-5-t-butylresorcinol, 2-n-butyl-5-methylresorcinol, 2-n-butyl-5-ethylresorcinol, 2-n-butyl-5-n-propylresorcinol, 2-n-butyl-5-isopropylresorcinol, 2,5-di-n-butylresorcinol, 2-n-butyl-5-t-butylresorcinol, 2-t-butyl-5-methylresorcinol, 2-t-butyl-5-ethylresorcinol, 2-t-butyl-5-n-propylresorcinol, 2-t-butyl-5-isopropylresorcinol, 2-t-butyl-5-n-butylresorcinol, 2,5-di-t-butylresorcinol, 3,5-dihydroxy-4-methyldiphenyl, 3,5-dihydroxy-4-ethyldiphenyl, 3,5-dihydroxy-4-n-propyldiphenyl, 3,5-dihydroxy-4-isopropyldiphenyl, 3,5-dihydroxy-4-n-butyldiphenyl, 3,5-dihydroxy-4-t-butyldiphenyl, 4-tolylpyrogallol, 5-tolylpyrogallol, 4-(2',3'-xylyl)pyrogallol, 5-(2',3'-xylyl)pyrogallol, 4-(2',4'-xylyl)pyrogallol, 5-(2',4'-xylyl)pyrogallol, 4-mesitylpyrogallol, 5-mesitylpyrogallol, 4-cumenylpyrogallol, 5-cumenylpyrogallol, 4-benzylpyrogallol, 5-benzylpyrogallol, 4-phenethylpyrogallol, 5-phenethylpyrogallol, 4-α-methylbenzylpyrogallol, 5-α-methylbenzylpyrogallol, 4-styrylpyrogallol, 5-styrylpyrogallol, 4-cinnamylpyrogallol, 5-cinnamylpyrogallol, 4-propenylpyrogallol, 5-propenylpyrogallol, 4-allylpyrogallol, 5-allylpyrogallol, 4-isopropenylpyrogallol, 5-isopropenylpyrogallol, 4-(1-butenyl)pyrogallol, 5-(1-butenyl)-pyrogallol, 4-(2-butenyl)pyrogallol, 5-(2-butenyl)-pyrogallol, 4-acetylpyrogallol, 5-acetylpyrogallol, 4-cyanopyrogallol, 5-cyanopyrogallol, 4-nitropyrogallol, 5-nitropyrogallol, methyl gallate, ethyl gallate, propyl gallate, isopropyl gallate, n-butyl gallate, sec-butyl gallate, t-butyl gallate, 4-methoxypyrogallol, 5-methoxypyrogallol, 4-benzoyloxypyrogallol, 5-benzoyloxypyrogallol, 3-tolylcatechol, 4-tolylcatechol, 3-(2',3'-xylyl)catechol, 4-(2',3'-xylyl)catechol, 3-(2',4'-xylyl)catechol, 4-(2',4'-xylyl)catechol, 3-mesitylcatechol, 4-mesitylcatechol, 3-cumenylcatechol, 4-cumenylcatechol, 3-benzylcatechol, 4-benzylcatechol, 3-phenethylcatechol, 4-phenethylcatechol, 3-α-methylbenzylcatechol, 4-α-methylbenzylcatechol, 3-styrylcatechol, 4-styrylcatechol, 3-cinnamylcatechol, 4-cinnamylcatechol, 3-propenylcatechol, 4-propenylcatechol, 3-isopropenylcatechol, 4-isopropenylcatechol, 3-allylcatechol, 4-allylcatechol, 3-(1-butenyl)catechol, 4-(1-butenyl)catechol, 3-(2-butenyl)catechol, 4-(2-butenyl)catechol, 3-acetoxycatechol, 4-acetoxycatechol, 3-benzoyloxycatechol, 4-benzoyloxycatechol, 3-methoxycarbonylcatechol, 4-methoxycarbonylcatechol, 3-acetylcatechol, 4-acetylcatechol, 3-cyanocatechol, 4-cyanocatechol, 3-nitrocatechol, 4-nitrocatechol, 2-tolylhydroquinone, 2-(2',3'-xylyl)hydroquinone, 2-(2',4'-xylyl)hydroquinone, 2-mesitylhydroquinone, 2-cumenylhydroquinone, 2-benzylhydroquinone, 2-phenethylhydroquinone, 2-(α-methylbenzyl)hydroquinone, 2-styrylhydroquinone, 2-cinnamylhydroquinone, 2-propenylhydroquinone, 2-isopropenylhydroquinone, 2-allylhydroquinone, 2-(1-butenyl)hydroquinone, 2-(2-butenyl)hydroquinone, 2-acetoxyhydroquinone, 2-benzoyloxyhydroquinone, 2-methoxycarbonylhydroquinone, 2-acetylhydroquinone, 2-cyanohydroquinone, 2-nitrohydroquinone, 4-tolylresorcinol, 2-toluylresorcinol, 4-(2',3'-xylyl)resorcinol, 2-(2',3'-xylyl)resorcinol, 4-(2',4'-xylyl)resorcinol, 2-(2',4'-xylyl)resorcinol, 4-mesitylresorcinol, 2-mesitylresorcinol, 4-cumenylresorcinol, 2-cumenylresorcinol, 4-benzylresorcinol, 2-benzylresorcinol, 4-phenethylresorcinol, 2-phenethylresorcinol, 4-(α-methylbenzyl)resorcinol, 2-(α-methylbenzyl)resorcinol, 4-styrylresorcinol, 2-styrylresorcinol, 4-cinnamylresorcinol, 2-cinnamylresorcinol, 4-propenylresorcinol, 2-propenylresorcinol, 4-isopropenylresorcinol, 2-isopropenylresorcinol, 4-allylresorcinol, 2-allylresorcinol, 4-(1-butenyl)resorcinol, 2-(1-butenyl)resorcinol, 4-(2-butenyl)resorcinol, 2-(2-butenyl)resorcinol, 4-acetoxyresorcinol, 2-acetoxyresorcinol, 4-benzoyloxyresorcinol, 2-benzoyloxyresorcinol, 4-methoxycarbonylresorcinol, 2-methoxycarbonylresorcinol, 4-acetylresorcinol, 2-acetylresorcinol, 4-cyanoresorcinol, 2-cyanoresorcinol, 4-nitroresorcinol, 2-nitroresorcinol, 2-tolylphloroglucinol, 2-(2',3'-xylyl)phloroglucinol, 2',4'-xylyl)phloroglucinol, 2-mesitylphloroglucinol, 2-cumenylphloroglucinol, 2-benzylphloroglucinol, 2-phenethylphloroglucinol, 2-α-methylbenzylphloroglucinol, 2-styrylphloroglucinol, 2-cinnamylphloroglucino, 2-propenylphloroglucinol, 2-isopropenylphloroglucinol, 2-allylphloroglucinol, 2-(1-butenyl)phloroglucinol, 2-(2-butenyl)phloroglucinol, 2-acetoxyphloroglucinol, 2-benzoyloxyphloroglulicnol, 2-methoxycarbonylphloroglucinol, 2-acetylphloroglucinol, 2-cyanophloroglucinol, 2-nitrophloroglucinol, and the like. Of these phenols (I), preferred are pyrogallol, catechol, hydroquinone, phloroglucinol, resorcinol, 5-chlororesorcinol, 5-methylresorcinol, 2-methylresorcinol, 3,5-dihydroxydiphenyl, 3,4,5-trihydroxydiphenyl, methyl gallate, ethyl gallate, n-propyl gallate, isopropyl gallate, 4-acetoxyresorcinol, 4-acetylresorcinol, and the like. These phenols (I) may be used alone or in admixture of two or more.

The phenols (II) used in the Composition A include, for example, phenol, o-cresol, m-cresol, p-cresol, o-ethylphenol, m-ethylphenol, p-ethylphenol, o-butylphenol, m-butylphenol, p-butylphenol, 3,5-xylenol, 2,4-xylenol, 2,5-xylenol, 3,4-xylenol, 2,3,5-trimethylphenol, o-phenylphenol, p-phenylphenol, isopropenylphenol, o-toluylphenol, p-tolylphenol, o-styrylphenol, p-styrylphenol, o-cinnamylphenol, p-cinnamylphenol, o-acetoxyphenol, m-acetoxyphenol, p-acetoxyphenol, o-benzoyloxyphenol, m-benzoyloxyphenol, p-benzoyloxyphenol, o-methoxyphenol, m-methoxyphenol, p-methoxyphenol, o-methoxycarbonylphenol, m-methoxycarbonylphenol, p-methoxycarbonylphenol, o-acetylphenol, m-acetylphenol, p-acetylphenol, p-hydroxydiphenyl and the like. Of these phenols (II), preferred are phenol, o-cresol, m-cresol, p-cresol, 2,5-xylenol, 3,5-xylenol, 2,3,5-trimethylphenol, o-t-butylphenol, m-t-butylphenol, p-t-butylphenol, p-hydroxydiphenyl and the like. These phenols (II) may be used alone or in admixture of two or more.

The proportion of phenols (I) and (II) used [(I)/(II)] is 1/99 to 100/0 by mole, preferably 5/95 to 100/0 by mole. When it is less than 1/99 by mole, the resistance to dry etching, resolution and thermal resistance of the resist aimed at by this invention are not satisfactory.

The carbonyl compounds used in the Composition A include, for example, those represented by the formula (IV)

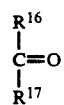

$$\begin{array}{c} R^{16} \\ | \\ C=O \\ | \\ R^{17} \end{array} \quad (IV)$$

wherein $R^{16}$ and $R^{17}$, which may be the same or different, represent hydrogen atoms, or alkyl, aryl, alkenyl or aralkyl groups as mentioned in the definitions of $R^1$, $R^2$, $R^3$, $R^4$ and $R^5$.

The carbonyl compounds (IV) include, for example, formaldehyde, paraformaldehyde, acetaldehyde, propylaldehyde, benzaldehyde, phenylacetaldehyde, α-phenylpropylaldehyde, β-phenylpropylaldehyde, tolylbenzaldehyde, mesitylbenzaldehyde, phenethylbenzaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, acrolein, crotonaldehyde, cinnamaldehyde, acetone, methyl ethyl ketone, diethyl ketone, methyl isobutyl ketone, methyl phenyl ketone, methyl benzyl ketone and the like. Of these carbonyl compounds, preferred are formaldehyde, acetaldehyde, benzaldehyde, p-hydroxybenzaldehyde, acrolein, acetone, methyl ethyl ketone, diethyl ketone, methyl isobutyl ketone, methyl phenyl ketone, methyl benzyl ketone and the like.

The carbonyl compounds may be used alone or in admixture of two or more, and are used in an amount of preferably 0.7 to 3 moles, more preferably 0.7 to 2 moles, per mole in total of the phenols. When the amount is less than 0.7 mole, the amount of the unreacted phenols remaining in the reaction system becomes large, and therefore, the softening point of the resulting alkali-soluble novolac resin becomes low. When the amount is more than 3 moles, the resulting alkali-soluble novolac resin is gelled.

In the production of the alkali-soluble novolac resin used in this invention, the phenol (I), the phenol (II) and the carbonyl compound are usually subjected to polycondensation with an acid catalyst. The acid catalyst includes inorganic acids such as hydrochloric acid, nitric acid, sulfuric acid and the like and organic acids such as formic acid, oxalic acid, acetic acid and the like. The amount of the acid catalyst used is usually $1 \times 10^{-7}$ to $5 \times 10^{-1}$ mole, preferably $1 \times 10^{-5}$ to $5 \times 10^{-1}$ mole, per mole in total of the phenols. When it is less than $1 \times 10^{-7}$ mole, the reaction rate is low and an alkali-soluble novolac resin having a high softening point cannot be obtained. When it is more than $5 \times 10^{-1}$ mole, the resulting alkali-soluble novolac resin is gelled.

In the reaction, no reaction medium may be used. However, water or hydrophilic solvents may be used alone or in combination as the reaction medium. In this case, the hydrophilic solvents used include, for example, alcohols such as methanol, ethanol, propanol, butanol and the like; ethers such as tetrahydrofuran, dioxane, diglyme and the like; esters such as ethyl acetate, propyl acetate, butyl acetate and the like; and nitriles such as acetonitrile, propionitrile, butyronitrile and the like. The amount of these reaction media is usually not more than 5,000 parts by weight, preferably 10 to 1,000 parts by weight, per 100 parts by weight in total of the phenols. When it is more than 5,000 parts by weight, the reaction rate becomes low.

The reaction temperature may be varied appropriately depending upon the starting materials, and is usually 10° to 200° C., preferably 60° to 160° C. When the reaction temperature is less than 10° C., the reaction rate is low, and when it exceeds 200° C., the resulting alkali-soluble novolac resin is gelled. The reaction is preferably carried out in an inert gas, for example, in a closed system filled with a nitrogen gas, a helium gas, an argon gas or the like, under pressure, and the difference between the internal and external pressures is usually 1 to 50 kg/cm², preferably 3 to 25 kg/cm².

After the completion of the reaction, the unreacted starting materials, acid catalyst and reaction medium present in the reaction system are removed generally by elevating the internal temperature to 130° to 230° C. and then removing the volatile matter by distillation under reduced pressure. Subsequently, the molten novolac resin is poured onto a steel belt or the like to recover the alkali-soluble novolac resin.

Also, after the completion of the reaction, the alkali-soluble novolac resin can be recovered by dissolving the reaction mixture in the above-mentioned hydrophilic solvent, adding the resulting solution to a precipitating agent such as water, n-hexane, petroleum ether, n-heptane or the like, separating the thus precipitated novolac resin and heat-drying the same.

A 1,2-quinonediazide compound is contained in the Composition A, and this 1,2-quinonediazide compound is usually used in a proportion of 5 to 100 parts by weight, preferably 10 to 50 parts by weight, per 100 parts by weight of the alkali-soluble novolac resin. When the proportion is less than 5 parts by weight, the effect of the 1,2-quinonediazide compound on insolubilization of alkali-soluble novolac resin becomes insufficient, and it becomes impossible to make a difference in solubility in a developing solution consisting of an aqueous alkaline solution between the radiation-irradiated portion and the radiation-unirradiated portion. Therefore, the formation of a pattern is difficult. When the amount of 1,2-quinonediazide compound added exceeds 100 parts by weight, it is impossible to decompose the whole of the 1,2-quinonediazide compound contained by irradiating the composition with a radiation for a short period of time, and hence, a part of the 1,2-quinonediazide comopund remains undecomposed. Therefore, the development with a developing solution consisting of an aqueous alkaline solution becomes difficult.

Said 1,2-quinonediazide compounds include, for example, 1,2-quinonediazidesulfonic acid esters of (poly)-hydroxybenzenes such as p-cresol-1,2-benzoquinonediazide-4-sulfonic acid ester, resonrcinol-1,2-naphthoquinonediazide- 4-sulfonic acid ester, pyrogallol-1,2-naphthoquinonediazide-5-sulfonic acid ester and the like; 1,2-quinonediazidesulfonic acid esters of (poly)hydroxyphenyl alkyl ketones or (poly)hydroxyphenyl aryl ketones such as 2,4-dihydroxyphenyl propyl ketone-1,2-benzoquinonediazide-4-sulfonic acid ester, 2,4-dihydroxyphenyl-n-hexyl ketone-1,2-naphthoquinonediazide-4-sulfonic acid ester, 2,4-dihydroxybenzophenone-1,2-naphthoquinonediazide-5-sulfonic acid ester, 2,3,4-trihydroxyphenyl-n-hexyl ketone-1,2-naphthoquinonediazide-4-sulfonic acid, 2,3,4-trihydroxybenzophenone-1,2-naphthoquinonediazide-4-sulfonic acid ester, 2,3,4-trihydroxybenzophenone-1,2-naphthoquinonediazide-5-sulfonic acid ester, 2,4,6-trihydroxybenzophenone-1,2-naphthoquinonediazide-4-sulfonic acid ester, 2,4,6-trihydroxybenzophenone-1,2-naphthoquinonediazide-5-sulfonic acid ester, 2,2',4,4'-tetrahydroxybenzophenone-1,2-naphthoquinonediazide-5-sulfonic acid ester, 2,3,4,4'-tetrahydroxybenzophenone-1,2-naphthoquinonediazide-4-sulfonic acid ester, 2,3,4,4'-tetrahydroxybenzophenone-1,2-naphthoquinonediazide-5-sulfonic acid ester, 2,2',3,4,6'-pentahydroxybenzophenone-1,2-naphthoquinonediazide-5-sulfonic acid ester, 2,3,3',4,4',5'-hexahydroxybenzophenone-1,2-naphthoquinonediazide-5-sulfonic acid ester, 2,2',3,4,4',6'-hexahydroxybenzophenone-1,2-naphthoquinonediazide-5-sulfonic acid ester and the like; 1,2-quinonediazidesulfonic acid ester of bis[(poly)hydroxyphenyl]alkanes such as bis(p-hydroxyphenyl)methane- 1,2-naphthoquinonediazide-4-sulfonic acid ester, bis(2,4-dihydroxyphenyl)methane-1,2-naphthoquinonediazide-5-sulfonic acid ester, bis(2,3,4-trihydroxyphenyl)methane-1,2-naphthoquinonediazide-5-sulfonic acid ester, 2,2-bis(p-hydroxyphenyl)propane-1,2-naphthoquinonediazide-4-sulfonic acid ester, 2,2-bis(2,4-dihydroxyphenyl)propane-1,2-naphthoquinonediazide-5-sulfonic acid ester, 2,2-bis(2,3,4-trihydroxyphenyl)propane-1,2-naphthoquinonediazide-5-sulfonic acid ester and the like; 1,2-quinonediazidesulfonic acid esters of alkyl (poly)hydroxybenzoates or aryl (poly)hydroxybenzoates such as lauryl 3,5-dihydroxybenzoate-1,2-naphthoquinonediazide-4-sulfonic acid ester, phenyl 2,3,4-trihydroxybenzoate-1,2-naphthoquinonediazide-5-sulfonic acid ester, propyl 3,4,5-trihydroxybenzoate-1,2-naphthoquinonediazide-5-sulfonic acid ester, phenyl 3,4,5-trihydroxybenzoate-1,2-naphthoquinonediazide-5-sulfonic acid ester and the like; 1,2-quinonediazidesulfonic acid esters of bis[(poly)-hydroxybenozyl]alkanes or bis[(poly)hydroxybenozyl]benzenes such as bis(2,5-dihydroxybenozyl)methane-1,2-naphthoquinonediazide-4-sulfonic acid ester, bis(2,3,4-trihydroxybenzoyl)methane-1,2-naphthoquinonediazide-5-sulfonic acid ester, bis(2,4,6-trihydroxybenzoyl)methane-1,2-naphthoquinonediazide-5-sulfonic acid ester, p-bis(2,5-dihydroxybenzoyl)benzene-1,2-naphthoquinonediazide-4-sulfonic acid ester, p-bis(2,3,4-trihydroxybenzoyl)benzene-1,2-naphthoquinonediazide-5-sulfonic acid ester, p-bis(2,4,6-trihydroxybenozyl)benzene-1,2-naphthoquinonediazide- 5-sulfonic acid ester and the like; 1,2-quinonediazidesulfonic acid esters of (poly)ethylene glycol-di[(-poly)hydroxybenzoates] such as ethylene glycol-di(3,5-dihydroxybenzoate)-1,2-naphthoquinonediazide-5-sulfonic acid ester, polyethylene glycoldi(3,4,5-trihydroxybenzoate)-1,2-naphthoquinonediazide-5-sulfonic acid esters and the like; 1,2-quinonediazidesulfonic acid esters of o-pyrone type natural coloring matters having hydroxyl groups; 1,2-quinonediazidesulfonic acid esters of Y-pyrone type natural coloring matters having hydroxyl groups; 1,2-quinonediazidesulfonic acid esters of diazine type natural coloring matters having hydroxyl groups; etc.

In addition to these 1,2-quinonediazide compounds, there may be used the 1,2-quinonediazide compounds described in J. Kosar, "Light-Sensitive Systems" 339-352 (1965), John Wiley & Suns, New York and W. S. De Forest, "Photoresist" 50 (1975), McGraw-Hill, Inc., New York.

Moreover, as described in Japanese Patent Application Kokai (Laid-Open) No. 17,112/83, there may be used, as the 1,2-quinonediazide compound, resins produced by condensing a 1,2-quinonediazidesulfonyl halide such as 1,2-naphthoquinonediazide-5-sulfonyl chloride, 1,2-naphthoquinonediazide-4-sulfonyl chloride or 1,2-benzoquinonediazide-4-sulfonyl chloride with the hydroxyl groups of the above-mentioned alkali-soluble novolac resin in an equivalent ratio of 0.001 to 0.5.

These 1,2-quinonediazide compounds may be used alone or in admixture of two or more.

In the Composition A, the above-mentioned alkali-soluble novolac resins may be used along with other alkali-soluble novolac resins which are used in the Composition B as described hereinafter.

Next, the Composition B is explained in detail below.

In the definitions of $R^6$ to $R^{15}$ in the formula (III), the 1,2-quinonediazidesulfonyl groups include, for example, 1,2-naphthoquinonediazide-5-sulfonyl, 1,2-naphthoquinonediazide-4-sulfonyl and 1,2-benzoquinonediazide-4-sulfonyl; the alkyl groups having 1 to 4 atoms include, for example, methyl, ethyl, propyl and butyl; the alkoxy groups having 1 to 4 carbon atoms include, for example, methoxy, ethoxy, propoxy and butoxy; the halogen atoms include, for example, chlorine and bromine; the acyl groups having 2 to 5 carbon atoms include, for example, acetyl, propyonyl, butyryl and valeryl; and the aralkyl groups having 7 to 9 carbon atoms include, for example, benzyl, phenethyl and phenylpropyl.

The 1,2-quinonediazide compounds represented by the formula (III) used as a photosensitizer in the Composition B are produced by reacting a 1,2-quinonediazide with a polyhydroxy compound represented by the formula (V):

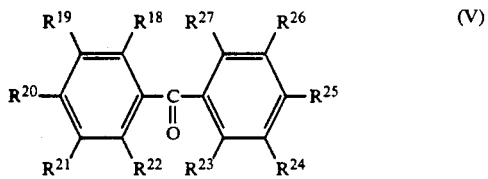

wherein $R^{18}$ to $R^{27}$, which may be the same or different, represent hydroxyl groups, hydrogen atoms, alkyl groups having 1 to 4 carbon atoms, alkoxy groups having 1 to 4 carbon atoms, halogen atoms, cyano groups, nitro groups, acyl groups having 2 to 5 carbon atoms or aralkyl groups having 7 to 9 carbon atoms, and the number (l) of the hydroxyl groups in the formula (V) is $5 \leq l \leq 10$, in the presence of a basic catalyst.

The polyhydroxy compound represented by the formula (V) includes, for example, 2,3,4,2',4'-pentahydroxybenzophenone, 2,3,4,2',5'-pentahydroxybenozophenone, 2,3,4,2',6'-pentahydroxybenzophenone, 2,3,4,3',4'-pentahydroxybenzophenone, 2,3,4,3',5'-pentahydroxybenzophenone, 2,3,4,2',3',4'-hexahydroxybenzophenone, 2,3,4,3',4',5'-hexahydroxybenzophenone, 2,3,4,2',4',6'-hexahydroxybenzophenone, 2,4,6,2',4'-pentahydroxybenzophenone, 2,4,6,2',5'-pentahydroxybenzophenone, 2,4,6,2',6'-pentahydroxybenzophenone, 2,4,6,3',4'-pentahydroxybenzophenone, 2,4,6,3',5'-pentahydroxybenzophenone, 2,4,6,3',4',5'-hexahydroxybenzophenone, 2,4,6,2',4',6'-hexahydroxybenzophenone, 2,3,4,5,2'-pentahydroxybenzophenone, 2,3,4,5,3'-pentahydroxybenzophenone, 2,3,4,5,4- -pentahydroxybenzophenone, 2,3,4,5,2',4'-hexahydroxybenzophenone, 2,3,4,5,2',5'-hexahydroxybenzophenone, 2,3,4,5,2',6'-hexahydroxybenzophenone, 2,3,4,5,3',4'-hexahydroxybenzophenone, 2,3,4,5,3',5'-hexahydroxybenzophenone, 2,3,4,5,2',3',4'-heptahydroxybenzophenone, 2,3,4,5,3',4',5'-heptahydroxybenzophenone, 2,3,4,5,2',4',6'-heptahydroxybenzophenone, 2,3,4,2',4'-pentahydroxy-5-methylbenzohenone, 2,3,4,2',4'-pentahydroxy-5-ethylbenzophenone, 2,3,4,2',4'-pentahydroxy-5-n-propylbenzophenone, 2,3,4,2',4'-pentahydroxy-5-n-butylbenzophenone, 2,3,4,2',5'-pentahydroxy-5-methylbenzophenone, 2,3,4,2',5'-pentahydroxy-5-n-propylbenzophenone, 2,3,4,2',6'-pentahydroxy-5-methylbenzophenone, 2,3,4,2',6'-pentahydroxy-5-n-propylbenzophenone, 2,3,4,3',4'-pentahydroxy-5-methylbenzophenone, 2,3,4,3',4'-pentahydroxy-5-n-propylbenzophenone, 2,3,4,3',5'-pentahydroxy-5-methylbenzophenone, 2,3,4,3',5'-pentahydroxy-5-n-propylbenzophenone, 2,3,4,2',-3',4'-hexahydroxy-5-methylbenzophenone, 2,3,4,2',3',4'-hexahydroxy-5-n-propylbenzophenone, 2,3,4,3',4',5'-hexahydroxy-5-methylbenzophenone, 2,3,4,3',4',5'-hexahydroxy-5-n-propylbenzophenone, 2,3,4,2',4',6'-hexahydroxy-5-methylbenzophenone, 2,3,4,2',4',6'-hexahydroxy-5-n-propylbenzophenone, 2,3,2',3',4'-pentahydroxy-4-methoxybenzophenone, 2,3,2',3',4'-pentahydroxy-4-ethoxybenzophenone, 2,3,2',3',4'-pentahydroxy-4-n-propoxybenzophenone, 2,3,2',3',4'-pentahydroxy-4-n-butoxybenzophenone, 2,3,3',4',5'-pentahydroxy-4-methoxybenzophenone, 2,3,3',4',5'-pentahydroxy-4-n-propoxybenzophenone, 2,3,2',4',6'-pentahydroxy-4-methoxybenzophenone, 2,3,2',4',6'-pentahydroxy-4-n-propoxybenzophenone, 2,3,4,2',4'-pentahydroxy-5-chlorobenzophenone, 2,3,4,2',4'-pentahydroxy-5-bromobenzophenone, 2,3,4,2',6'-pentahydroxy-5-chlorobenzophenone, 2,3,4,2',6'-pentahydroxy-5-bromobenzophenone, 2,3,4,3',4',-5'-hexahydroxy-5-chlorobenzophenone, 2,3,4,3',4',5'-hexahydroxy-5-bromobenzophenone, 2,3,4,2',4'-pentahydroxy-5-cyanobenzophenone, 2,3,4,3',4',5'-hexahydroxy-5-cyanobenzophenone, 2,3,4,2',4'-pentahydroxy-5-nitrobenzophenone, 2,3,4,3',4',5'-hexahydroxy-5-nitrobenzophenone, 2,4,3',-4',5'-pentahydroxy-5-acetylbenzophenone, 2,4,3',4',5'-pentahydroxy-5-benzoylbenzophenone, 2,3,4,3',4',5'-hexahydroxy-5-acetylbenzophenone, 2,3,4,3',4',5'-hexahydroxy-5-benzoylbenzophenone, 2,4,3',4',5'-pentahydroxy-5-benzoylbenzophenone, 2,3,4,3',4',5'-hexahydroxy-5-benzoylbenzophenone and the like. These polyhydroxy compounds may be used alone or in admixture of two or more.

The above-mentioned 1,2-quinonediazides include, for example, 1,2-quinonediazidesulfonyl halides such as 1,2-naphthoquinonediazide-5-sulfonyl chloride, 1,2-naphthoquinonediazide-4-sulfonyl chloride, 1,2-benzoquinonediazide-4-sulfonyl chloride and the like. These 1,2-quinonediazides may be used alone or in admixture of two or more.

The amount of the 1,2-quinonediazide compound used based on the compound represented by the formula (V) is appropriately adjusted depending upon the number of the hydroxyl groups in the compound of the formula (V) and is usually 0.1 to 1 mole per mole of the hydroxyl group of the compound of the formula (V) though not critical.

The basic catalyst includes, for example, amines such as trimethylamine, triethylamine, tripropylamine, pyridine, tetramethylammonium hydroxide and the like and also inorganic alkalis such as sodium hydroxide, potassium hydroxide, sodium carbonate and the like.

The amount of the basic catalyst used is usually 0.8 to 2 moles, preferably 1 to 1.5 moles, per mole of the 1,2-quinonediazide compound.

In the above-mentioned reaction, a reaction medium is usually used, which includes, for example, ketones such as acetone, methyl ethyl ketone, methyl isobutyl ketone and the like; cyclic ethers such as dioxane, tetrahydrofuran and the like; cyclic ketones such as cyclopentanone, cyclohexanone and the like; amides such as N,N-dimethylformamide, N,N-dimethylacetamide and the like; esters such as γ-butyrolactone, ethylene carbonate, propylene carbonate and the like; pyrrolidone; N-methylpyrrolidone; and water. The amount of the reaction medium used is usually 100 to 1,000 parts by weight per 100 parts by weight of the compound of formula (V). Also, the reaction temperature is usually −30 to +60° C., preferably 0° to 40° C. in the above reaction.

The compound of the formula (III) used in the Composition B includes, for example, 2,3,4,2',4'-pentahydroxybenzophenone-1,2-naphthoquinonediazide-5-sulfonic acid ester, 2,3,4,2',5'-pentahydroxybenzophenone-1,2-naphthoquinonediazide- 5-sulfonic acid ester, 2,3,4,2',6'-pentahydroxybenzophenone-1,2-naphthoquinonediazide-5-sulfonic acid ester, 2,3,4,-3',4'-pentahydroxybenzophenone-1,2-naphthoquinonediazide-5-sulfonic acid ester, 2,3,4,3',5'-pentahydroxybenzophenone-1,2-naphthoquinonediazide-5-sulfonic acid ester, 2,3,4,2',-3',4'-hexahydroxybenzophenone-1,2-naphthoquinonediazide-5-sulfonic acid ester, 2,3,4,3',4',5'-hexahydroxybenzophenone-1,2-naphthoquinonediazide-5-sulfonic acid ester, 2,3,4,2',4',6'-hexahydroxybenzophenone-1,2-naphthoquinonediazide-5-sulfonic acid ester, 2,4,6,2',4'-pentahydroxybenzophenone-1,2-naphthoquinonediazide-5-sulfonic acid ester, 2,4,6,2',5'-pentahydroxybenzophenone-1,2-naphthoquinonediazide-5-sulfonic acid ester, 2,4,6,2',6'-pentahydroxybenzophenone-1,2-naphthoquinonediazide-5-sulfonic acid ester, 2,4,6,3',4'-pentahydroxybenzophenone-1,2-naphthoquinonediazide-5-sulfonic acid ester, 2,4,6,3',-5'-pentahydroxybenzophenone-1,2-naphthoquinonediazide-5-sulfonic acid ester, 2,4,6,3',4',5'-hexahydroxybenzophenone-1,2-naphthoquinonediazide-5-sulfonic acid ester, 2,4,6,2',4',6'-hexahydroxybenzophenone-1,2-naphthoquinonediazide-5-sulfonic acid ester, 2,3,4,5,2'-pentahydroxybenzophenone-1,2-naphthoquinonediazide-5-sulfonic acid ester, 2,3,4,5,3'-pentahydroxybenzophenone-1,2-naphthaoquinonediazide-5-sulfonic acid ester, 2,3,4,5,4'-pentahydroxybenzophenone-1,2-naphthoquinonediazide-5-sulfonic acid ester, 2,3,4,5,2',4'-hexahydroxybenzophenone-1,2-naphthoquinonediazide-5-sulfonic acid ester, 2,3,4,5,2',5'-hexahydroxybenzophenone-1,2-naphthoquinonediazide-5-sulfonic acid ester, 2,3,4,5,2',6'-hexahydroxybenzophenone-1,2-naphthoquinonediazide-5-sulfonic acid ester, 2,3,4,5,3',4'-hexahydroxybenzophenone-1,2-naphthoquinonediazide-5-sulfonic acid ester, 2,3,4,5,3',5'-hexahydroxybenzophenone-1,2-naphthoquinonediazide-5-sulfonic acid ester, 2,3,4,5,2',3',4'-heptahydroxybenzophenone-1,2-naphthoquinonediazide-5-sulfonic acid ester, 2,3,4,5,3',-4',5'-heptahydroxybenzophenone-1,2-naphthoquinonediazide-5-sulfonic acid ester, 2,3,4,5,2',4',6'-heptahydroxybenzophenone-1,2-naphthoquinonediazide-5-sulfonic acid ester, 2,3,4,2',4'-pentahydroxy-5-methylbenzophenone-1,2-naphthoquinonediazide-5-sulfonic acid ester, 2,3,4,2',4'-pentahydroxy-5-ethylbenzophenone-1,2-naphthoquinonediazide-5-sulfonic acid ester, 2,3,4,2',4'-pentahydroxy-5-n-propylbenzophenone-1,2-naphthoquinonediazide-5-sulfonic acid ester, 2,3,4,2',4'-pentahydroxy-5-n-butylbenzophenone-1,2-naphthoquinonediazide-5-sulfonic acid ester, 2,3,4,2',5'-pentahydroxy-5-methylbenzophenone-1,2-naphthoquinonediazide-5-sulfonic acid ester, 2,3,4,2',5'-pentahydroxy-5-n-propylbenzophenone-1,2-naphthoquinonediazide-5-sulfonic acid ester, 2,3,4,2',6'-pentahydroxy-5-methylbenzophenone-1,2-naphthoquinonediazide-5-sulfonic acid ester, 2,3,4,2',6'-pentahydroxy-5-n-propylbenzophenone-1,2-naphthoquinonediazide-5-sulfonic acid ester, 2,3,4,3',4'-pentahydroxy-5-methylbenzophenone-1,2-naphthoquinonediazide-5-sulfonic acid ester, 2,3,4,3',4'-pentahydroxy-5-n-propylbenzophenone-1,2-naphthoquinonediazide-5-sulfonic acid ester, 2,3,4,3',5'-pentahydroxy-5-methylbenzophenone-1,2-naphthoquinonediazide-5-sulfonic acid ester, 2,3,4,3',5'-pentahydroxy-5-n-propylbenzophenone-1,2-naphthoquinonediazide-5-sulfonic acid ester, 2,3,4,2',3',4'-hexahydroxy-5-methylbenzophenone-1,2-naphthoquinonediazide-5-sulfonic acid ester, 2,3,4,2',3',4'-hexahydroxy-5-n-propylbenzophenone-1,2-naphthoquinonediazide-5-sulfonic acid ester, 2,3,4,3',4',5'-hexahydroxy-5-methylbenzophenone-1,2-naphthoquinonediazide-5-sulfonic acid ester, 2,3,4,3',4'-5'-hexahydroxy-5-n-propylbenzophenone-1,2-naphthoquinonediazide-5-sulfonic acid ester, 2,3,4,2',4',6'-hexahydroxy-5-methylbenzophenone-1,2-naphthoquinonediazide-5-sulfonic acid ester, 2,3,4,2',4',6'-hexahydroxy-5-n-propylbenzophenone-1,2-naphthoquinonediazide-5-sulfonic acid ester, 2,3,2',3',4'-pentahydroxy-4-methoxybenzophenone-1,2-naphthoquinonediazide-5-sulfonic acid ester, 2,3,2',3',4'-pentahydroxy-4-ethoxybenzophenone-1,2-naphthoquinonediazide-5-sulfonic acid ester, 2,3,2',3',4'-pentahydroxy-4-n-propoxybenzophenone-1,2-naphthoquinonediazide-5-sulfonic acid ester, 2,3,2',3',4'-pentahydroxy-4-n-butoxybenzophenone-1,2-naphthoquinonediazide-5-sulfonic acid ester, 2,3,3',4',5'-pentahydroxy-4-methoxybenzophenone-1,2-naphthoquinonediazide-5-sulfonic acid ester, 2,3,3',4',5'-pentahydroxy-4-n-propoxybenzophenone-1,2-naphthoquinonediazide-5-sulfonic acid ester, 2,3,2',4',6'-pentahydroxy-4-methoxybenzophenone-1,2-naphthoquinonediazide-5-sulfonic acid ester, 2,3,2',4',6'-pentahydroxy-4-n-propoxybenzophenone-1,2-naphthoquinonediazide- 5-sulfonic acid ester, 2,3,4,2',4'-pentahydroxy-5-chlorobenzophenone-1,2-naphthoquinonediazide-5-sulfonic acid ester, 2,3,4,2',4'-pentahydroxy-5-bromobenzophenone-1,2-naphthoquinonediazide-5-sulfonic acid ester, 2,3,4,2',6'-pentahydroxy-5-chlorobenzophenone-1,2-naphthoquinonediazide-5-sulfonic acid ester, 2,3,4,2',6'-pentahydroxy-5-bromobenzophenone-1,2-naphthoquinonediazide-5-sulfonic acid ester, 2,3,4,3',4',5'-hexahydroxy-5-chlorobenzophenone-1,2-naphthoquinonediazide-5-sulfonic acid ester, 2,3,4,3',4',5'-hexahydroxy-5-bromobenzophenone-1,2-naphthoquinonediazide-5-sulfonic acid ester, 2,3,4,2',-4'-pentahydroxy-5-cyanobenzophenone-1,2-naphthoquinonediazide-5-sulfonic acid ester, 2,3,4,3',4', 5'-hexahydroxy-5-cyanobenzophenone-1,2-naphthoquinonediazide-5-sulfonic acid ester, 2,3,4,2',4'-pentahydroxy-5-nitrobenzophenone-1,2-naphthoquinonediazide-5-sulfonic acid ester, 2,3,4,3',-4',5'-hexahydroxy-5-nitrobenzophenone-1,2-naphthoquinonediazide-5-sulfonic acid ester, 2,4,3',4',5'-pentahydroxy-5-acetylbenzophenone-1,2-naphthoquinonediazide-5-sulfonic acid ester, 2,4,3',4',5'-pentahydroxy-5-benzoylbenzophenone-1,2-naphthoquinonediazide-5-sulfonic acid ester, 2,3,4,3',4',5'-hexahydroxy-5-acetylbenzophenone-1,2-naphthoquinonediazide-5-sulfonic acid ester, 2,3,4,3',4',5'-hexahydroxy-5-benzoylbenzophenone-1,2-naphthoquinonediazide-5-sulfonic acid ester, 2,4,3',4',5'-pentahydroxy-5-benzylbenzophenone-1,2-naphthoquinonediazide-5-sulfonic acid ester, 2,3,4,3',4',5'-hexahydroxy-5-benzylbenzophenone-1,2-naphthoquinonediazide-5-sulfonic acid ester, 2,3,4,2',4'-pentahydroxybenzophenone- 1,2-naphthoquinonediazide-4-sulfonic acid ester, 2,3,4,2',6'-pentahydroxybenzophenone-1,2-naphthoquinonediazide-4-sulfonic acid ester, 2,3,4,3',-4',5'-hexahydroxybenzophenone-1,2-naphthoquinonediazide-4-sulfonic acid ester, 2,4,6,2',6'-pentahydroxybenzophenone-1,2-naphthoquinonediazide-4-sulfonic acid ester, 2,4,6,3',4',5'-hexahydroxybenzophenone-1,2-naphthoquinonediazide-4-sulfonic acid ester, 2,3,4,5,4'-pentahydroxybenzophenone-1,2-naphthoquinonediazide-4-sulfonic acid, 2,3,4,5,2',6'-hexahydroxybenzophenone-1,2-naphthoquinonediazide-4-sulfonic acid ester, 2,3,4,5,3',4',5'-heptahydroxybenzophenone-1,2-naphthoquinonediazide-4-sulfonic acid ester, 2,3,4,2',4'-pentahydroxy-5-methylbenzophenone-1,2-naphthoquinonediazide-4-sulfonic acid ester, 2,3,4,2',6'-pentahydroxy-5-methylbenzophenone-1,2-naphthoquinonediazide-4-sulfonic acid ester, 2,3,4,3',4',5'-hexahydroxy-5-methylbenzophenone-1,2-naphthoquinonediazide-4-sulfonic acid ester, 2,3,3',4',5'-pentahydroxy-4-methoxybenzophenone-1,2-naphthoquinonediazide-4-sulfonic acid ester, 2,3,3,4,3',4',5'-hexahydroxy-5-chlorobenzophenone-1,2-naphthoquinonediazide-4-sulfonic acid ester, 2,3,4,3',4',5'-hexahydroxy-5-acetylbenzophenone-1,2-naphthoquinonediazide-4-sulfonic acid ester, 2,3,4,3',4',5'-hexahydroxy-5-benzoylbenzophenone-1,2-naphthoquinonediazide-4-sulfonic acid ester, 2,3,4,2',6'-pentahydroxybenzophenone-1,2-benzoquinonediazide-4-sulfonic acid ester, 2,3,4,3',4',5'-hexahydroxybenzophenone-1,2-benzoquinonediazide-4-sulfonic acid ester, 2,4,6,3',4',5'-hexahydroxybenzophenone-1,2-benzoquinonediazide-4-sulfonic acid ester, 2,3,4,3',-4',5'-hexahydroxy-5-methylbenzophenone-1,2-benzoquinonediazide-4-sulfonic acid ester, 2,3,3',4',5'-pentahydroxy-4-methoxybenzophenone-1,2-benzoquinonediazide-4-sulfonic acid ester, 2,3,4,3',4',5'-hexahydroxy-5-benzoylbenzophenone-1,2-benzoquinonediazide-4-sulfonic acid ester and the like.

In the Composition B, the amount of the compound represented by the formula (III) contained is 5 to 100 parts by weight, preferably 10 to 50 parts by weight, per 100 parts by weight of the alkali-soluble resin. When this amount is less than 5 parts by weight, the amount of a carboxylic acid produced owing to the 1,2-quinonediazide compound absorbing radiation becomes small, and hence, patterning becomes difficult. When the amount is more than 100 parts by weight, the irradiation with a radiation for a short period of time does not enable the whole of the 1,2-quinonediazide compound to be decomposed, and the development with a developing solution consisting of an aqueous alkaline solution becomes difficult.

In the Composition B, it is possible to add other 1,2-quinonediazide compounds in such an amount as not to impair the properties of the final product. These other 1,2-quinonediazide compounds include, for example, those used in the Composition A.

The alkali-soluble resin used in the Composition B includes, for example, alkali-soluble novolac resins. This alkali-soluble novolac resin is prepared by addition-condensing phenols with carbonyl compounds in the presence of an acid catalyst.

The phenols used to produce the alkali-soluble novolac resins in the Composition B include, for example, phenol, o-cresol, m-cresol, p-cresol, o-ethylphenyl, m-ethylphenol, p-ethylphenol, o-butylphenol, m-butylphenol, p-butylphenol, 2,3-xylenol, 2,4-xylenol, 2,5-xylenol, 3,4-xylenol, 3,5-xylenol, 2,3,5-trimethylphenol, p-phenylphenol, hydroquinone, catechol, resorcinol, 2-methylresorcinol, pyrogallol, α-naphthol, bisphenol A, dihydroxybenzoic acid esters, gallic acid esters and the like. Of these compounds, preferred are phenol, o-cresol, m-cresol, p-cresol, 2,5-xylenol, 3,5-xylenol, 2,3,5-trimethylphenol, resorcinol, 2-methylresorcinol, bisphenol A and the like. These phenols may be used alone or in admixture of two or more.

Also, the carbonyl compounds used to produce the alkali-soluble novolac resins in the Composition B and the amount thereof are the same as stated as to the Composition A.

Moreover, reaction conditions used in the condensation reaction, such as acid catalyst, amount thereof, reaction medium, amount thereof, reaction temperature and the like, and the method of preparing the alkali-soluble novolac resin are the same as stated as to the Composition A.

The alkali-soluble resins used in the Composition B includes alkali-soluble novolac resins, and in addition thereto, for example, polyhydroxystyrene, its derivatives, styrene-maleic anhydride copolymer, polyvinyl hydroxybenzoate, carboxyl-containing (meth)acrylate resins and the like. These alkali-soluble resins may be used alone or in admixture of two or more.

In the Compositions A and B, a sensitizer may be contained in order to increase the sensitivity as resist. The sensitizer includes, for example 2H-pyrido[3,2-b]-1,4-oxazin-3-[4H]-ones, 10H-pyrido[3,2-b]-[1,4]-benzothiazines, urazoles, hydantoins, barbituric acids, glycine anhydrides, 1-hydroxybenzotriazoles, alloxans, maleimides and further sensitizers described in Japanese Patent Publication Nos. 12,242/73 and 35,402/73, Japanese Patent Application Kokai (Laid-Open) Nos. 37,641/83 and 149,042/83 and the like. The amount of the sensitizer contained is usually not more than 100 parts by weight, preferably 4 to 60 parts by weight, per 100 parts by weight of the 1,2-quinonediazide compound.

Moreover, the Compositions A and B may contain a surface active agent and the like for improving coatability, for example, striation, and the developability of the radiation-irradiated portion after the formation of the dry coating. The surface active agent includes nonionic surfactants, for example, polyoxyethylene alkyl ethers such as polyoxyethylene lauryl ether, polyoxyethylene stearyl ether, polyoxyethylene oleyl ether and the like; polyoxyethylene alkyl phenol ethers such as polyoxyethylene octyl phenol, ether, polyoxyethylene nonyl phenol ether and the like; polyethylene glycol difatty acid esters such as polyethylene glycol dilaurate, polyethylene glycol distearate and the like; fluorine-containing surfactants such as F Top EF 301, EF 303 and EF 352 (these are products of Shin Akita Kasei K. K.), Megafac F 171 and F 173 (these are products of DANINIPPON INK & CHEMICALS), Fluorad FC 430 and FC 431 (these are products of Sumitomo 3M Limited), Asahi Guard AG 710 and Surflon S-382, SC 101, SC 102, SC 103, SC 104, SC 105 and SC 106 (these are products of Asahi Glass Co., Ltd.), and straight chainlike fluorine-containing surfactants having fluorinated alkyl groups or perfluoroalkyl groups as described in Japanese Patent Application Kokai (Laid-Open) No. 178,242/82 and the like; organosiloxane polymer KP 341 (a product of Shin-Etsu Chemical Co., Ltd.); and acrylic or methacrylic (co)polymer Polyflow No. 75 and No. 95 (these are products of Kyoeisha Yushikagaku Kogyo K. K.) and the like. The amount of these surface active agents contained is usually not more than 2 parts by weight, preferably not more than 1 part by weight, per 100 parts by weight of the solids content of the Composition A or B.

Also, the Compositions A and B may contain a coloring agent for visualizing the latent image in the radiation-irradiated portions and for reducing the adverse effect of halation during irradiation with a radiation, or may contain an adhering aid for improving the adhesiveness to substrate.

The coloring agent includes, for example, oil-soluble dyes, disperse dyes and basic dyes such as Methyl Violet 2B (CI No. 42555), Malchite Green (CI No. 42000), Victoria Blue B (CI No. 44045), Neutral Red (CI No. 50040), Solvent Yellow 2 (CI No. 11020), Solvent Yellow 6 (CI No. 11390), Solvent Yellow 14 (CI No. 12055), Solvent Yellow 15 (CI No. 18820), Solvent Yellow 16 (CI No. 12700), Solvent Yellow 21 (CI No. 18690), Solvent Yellow D-33 (CI No. 47000), Solvent Yellow 56 (CI No. 11021), Solvent Orange 1 (CI No. 11920), Solvent Orange 2 (CI No. 12100), Solvent Orange 14 (CI No. 26020), Solvent Orange 40, Solvent Red 3 (CI No. 12010), Solvent Red 8 (CI No. 12715), Solvent Red 23 (CI No. 26100), Solvent Red 24 (CI No. 26105), Solvent Red 25 (CI No. 26110), Solvent Red 27 (CI No. 26125), SOlvent Red (CI No. 45170B), Disperse Red 9 (CI No. 60505), Oil Scarlet 308 (CI No. 21260), Solvent Brown (CI No. 12020), Disperse Yellow 1 (CI No. 10345), Disperse Yellow 3 (CI No. 11855), Disperse Yellow 4 (CI No. 12770), Disperse Yellow 8 (CI No. 27090), Disperse Yellow 42 (CI No. 10338), Disperse Orange 1 (CI No. 11080), disperse Orange 3 (CI No. 11005), Disperse Orange 5 (CI No. 11100), Disperse Orange 11 (CI No. 60700), Disperse Red 1 (CI No. 11110), Disperse Red 4 (CI No. 60755), Disperse Red 11 (CI No. 62015), Disperse Red 15 (CI No. 60710), Disperse Red 58 (CI No. 11135) and the like; methine type dyes such as Miketon Fast Yellow 7G, Miketone Fast Orange 5R (these are products of Mitsuitoatsu Senryo K. K.), Foron (product of Sandoz), Macrolex Yellow 6G (product of Bayer) and the like; fluorescent brightening agents such as stilbene, 4,4-diaminostilbenesulfonic acid derivatives, coumarine derivatives, pyrozoline derivatives and the like; and hydroxyazo dyes stated in Japanese Patent Application Kokai (Laid-Open) No. 142,538/84 and the like. The amount of these coloring agents contained is usually not more than 6 parts by weight, preferably not more than 4 parts by weight, per 100 parts by weight of the solids content of the Composition A or B.

The adhering aid includes, for example, silicon compounds such as 3-aminopropyltriethoxysilane, vinyltrichlorosilane, 2-(3,4-epoxycyclohexylethyl)trimethoxysilane and the like. The amount of these adhering aids contained is usually not more than 4 parts by weight, preferably not more than 2 parts by weight, per 100 parts by weight of the Composition A or B.

In addition, the Compositions A and B may, if necessary, contain a storage stabilizer, anti-foaming agent and the like.

The Composition A or B is prepared by dissolving an alkali-soluble resin, a 1,2-quinonediazide compound and various compounding agents in the necessary amounts in a solvent and filtering the resulting solution through a filter having a pore diameter of, for example, about 0.2 μm.

The solvent used in this case includes, for example, glycol ethers such as ethylene glycol monomethyl ether, ethylene glycol monoethyl ether and the like; cellosolve esters such as methyl cellosolve acetate, ethyl cellosolve acetate and the like; ketones such as methyl ethyl ketone, cyclohexanone and the like; and esters such as ethyl acetate, butyl acetate, methyl lactate, ethyl lactate and the like. These solvents may be used alone or in admixture of two or more. Moreover, a high boiling solvent may be added such as an aromatic hydrocarbon, for example, toluene, xylene or the like; an ether, for example, benzyl ethyl ether, dihexyl ether or the like; a glycol ether, for example, diethylene glycol monomethyl ether, diethylene glycol monoethyl ether or the like; a ketone, for example, acetonylacetone, isophorone or the like; a fatty acid, for example, caproic acid, caprylic acid or the like; an alcohol, for example, 1-octanol, 1-nonanol, benzyl alcohol or the like; an ester, for example, benzyl acetate, ethyl benzoate, diethyl oxalate, diethyl maleate, ethylene carbonate, propylene carbonate, phenyl cellosolve acetate or the like; or a lactone, for example, γ-butyrolactone, δ-valerolactone or the like.

In coating the Composition A or B on a silicon wafer or the like, for example, a 5 to 50% by weight solution of the Composition A or B is applied to the substrate by a spin coating, flow-coating, roll-coating or the like.

The developing solution for the Composition A or B is an aqueous alkaline solution prepared by dissolving in water an inorganic alkali such as sodium hydroxide, potassium hydroxide, sodium carbonate, sodium silicate, sodium meta-silicate, ammonia water or the like; a primary amine such as ethylene, n-propylamine or the like; a secondary amine such as diethylamine, di-n-propylamine or the like; a tertiary amine such as triethylamine, methyldiethylamine or the like; an alcoholamine such as dimethylethanolamine, triethanolamine or the like; a quaternary ammonium salt such as tetramethylammonium hydroxide, tetraethylammonium hydroxide or the like or a cyclic amine such as pyrole, piperidine, 1,8-diazabicyclo(5,4,0)-7-undecene, 1,5-diazabicyclo(4,3,0)-5-nonane or the like. When preparing an integrated circuit in which the use of a developing solution containing a metal is objected to, it is preferred to use an aqueous alkaline solution of a quaternary ammonium salt or a cyclic amine.

The developing solution may further contain an appropriate amount of an aqueous organic solvent, for example, an alcohol such as methanol, ethanol or the like, and a surface active agent.

The positive type radiation-sensitive resin composition of this invention is excellent in dry-etching resistance, resolution and heat resistance, and particularly useful as positive type resists for producing integrated circuits in which a resist pattern is formed by irradiation with a radiation such as a visible light, an ultraviolet ray, a far-ultraviolet ray, an X-ray, a molecular beam, an ion ray, an electron beam, a γ-ray or the like, and also useful as a positive type resist for producing a mask.

This invention is further explained in more detail below referring to Examples.

In the Examples, the number of the 1,2-quinonediazidesulfonyl groups in 1,2-quinonediazide compounds represented by the formula (III) used is an average value of the reaction product.

EXAMPLE 1

Into a 1,500-ml autoclave reactor were charged 110 g of resorcinol, 54 g of 90% by weight acetaldehyde, 0.3 g of oxalic acid and 73 g of n-butanol, and the resulting mixture was subjected to polycondensation with stirring for 10 hours while maintaining the internal temperature at 140° C. After the completion of the reaction, the reaction mixture was poured into a large amount of water to precipitate the novolac resin produced. Subsequently, the precipitate was recovered, vacuum-dried at 40° C. for 24 hours and subjected to removal of water, unreacted materials and n-butanol to obtain an alkali-soluble novolac resin.

In 37.5 g of ethylcellosolve acetae were dissolved 10 g of the alkali-soluble novolac resin obtained and 2.5 g of bis(2,4-dihydroxyphenyl)methane-1,2-naphthoquinonediazinde-5-sulfonic acid tetraester, and the resulting solution was filtered through a membrane filter having a pore diameter of 0.2 μm to prepare a solution of the Composition A of this invention.

The solution thus obtained was spin-coated on a silicon wafer having a silicon oxide film by means of a spinner, and pre-baked at 90° C. for 2 minutes to obtain a resist film having a thickness of 1.2 μm.

Subsequently, the resist film was irradiated with ultraviolet rays having a center wavelength of 436 nm through a pattern mask for resolution test, and thereafter, developed with a 1% by weight aqueous tetramethylammonium hydroxide (referred to hereinafter as TMA) solution to form a resist pattern.

As a result, the resist pattern having a line width of 0.9 μm was quite faithful to the pattern mask, and the resolution was good.

The silicon wafer having said resist pattern was placed on a hot plate for 5 minutes, during which heat deformation of the resist pattern was observed while changing the temperature of the hot plate. Presuming the highest temperature at which the resist pattern is not deformed as the heat-resistance temperature, the heat-resistance temperature of this resist pattern was 170° C., and this proves that the resist pattern has a very good heat resistance.

Further, the resist pattern thus obtained was mounted on a parallel flat plate type plasma etching apparatus (electrode distance: 40 mm), and the resistance of the resist pattern to dry etching was observed under the conditions that the output was 100 W and the gas pressure of tetrafluoromethane/oxygen mixture (95/5 by volume) was 15 pa. The selection ratio of the resist pattern (the ratio of the speed at which the silicon oxide film is etched to the speed at which the resist pattern is etched) was 4.0, which is a very high value and proves that the resist pattern is excellent in resistance to dry etching.

COMPARATIVE EXAMPLE 1

In a 500-ml, three-necked, separable flask were charged 158 g of m-cresol, 18 g of p-cresol, 125 g of 37% by weight aqueous formaldehyde solution (hereinafter referred to as formaline) and 0.06 g of oxalic acid, and the resulting mixture was subjected to polycondensation with stirring for 3 hours while keeping the internal temperature at 100° C. After the completion of the reaction, the reaction mixture was poured into a large amount of water to precipitate the resulting novolac. Subsequently, the precipitate was recovered, vacuum-dried at 40° C. for 24 hours and then subjected to removal of water and unreacted materials to obtain an alkali-soluble novolac resin.

The alkali-soluble novolac resin thus obtained was subjected to the same treatment as in Example 1 to prepare a resin composition solution. This solution was subjected to the same treatment as in Example 1, except that development was effected with 2% by weight aqueous TMA solution to form a resist pattern. As a result, it was confirmed that the resist pattern was quite faithful to the test pattern and had a minimum line width of 1.2 μm. The resolution of the resist pattern thus obtained was 0.3 μm lower than that in Example 1. Moreover, the resist pattern thus obtained had a heat-resistance temperature as low as 110° C. Furthermore, the selection ratio of this resist pattern in respect of resistance to dry etching was as bad as 2.1.

EXAMPLES 2 to 19

The same procedure as in Example 1 was repeated, except that the phenols (I) and (II) shown in Table 1 were substituted for the resorcinol and the carbonyl compounds shown in Table 1 were substituted for the acetaldehyde to prepare solutions of Compositions A of this invention. These solutions were subjected to the same treatment as in Example 1 to form resist patterns, and the heat resistance temperatures, dry-etching resistances and resolutions of the resist patterns were examined to obtain the results shown in Table 1, from which it can be seen that all the resist patterns are high in heat-resistance temperature and excellent in dry-etching resistance and resolution.

TABLE 1

| Example No. | Phenol (I)/Phenol (II) (amount) (molar ratio) | Carbonyl compound (amount) | Heat-resistance temp. (°C.) | Dry-etching resistance (selc. ratio) | Resolution (μm) |
|---|---|---|---|---|---|
| 2 | Resorcinol/m-Cresol (33 g/76 g) (30/70) | Acetaldehyde (54 g) | 160 | 4.2 | 0.8 |
| 3 | Resorcinol/m-Cresol/ 3,5-Xylenol (22 g/69.2 g/19.6 g) (20/64/16) | Acetaldehyde (73 g) | 170 | 4.3 | 0.7 |
| 4 | Pyrogallol (126 g) | Acetaldehyde (54 g) | 140 | 3.6 | 0.7 |
| 5 | Pyrogallol/p-Cresol (50.4 g/64.8 g) (40/60) | Formaline (90 g) | 160 | 3.8 | 0.7 |
| 6 | Pyrogallol/m-Cresol/ p-Cresol (50.4 g/43.2 g/ 32.4 g) (30/40/30) | Acrolein (62 g) | 130 | 3.6 | 0.7 |
| 7 | Phloroglucinol/p-Cresol (37.8 g/75.6 g) (30/70) | Benzaldehyde (103 g) | 130 | 3.8 | 0.7 |
| 8 | Phloroglucinol/2,5-Xylenol (88.2 g/36.6 g) (70/30) | p-Hydroxybenzaldehyde (121 g) | 140 | 3.9 | 0.8 |
| 9 | 2-Methylresorcinol (124 g) | Formaline (90 g) | 190 | 3.9 | 0.9 |
| 10 | 2-Methylresorcinol/ p-Cresol (99.2 g/21.6 g) (80/20) | Acetaldehyde (54 g) | 160 | 4.0 | 0.8 |
| 11 | 2-Methylresorcinol/ 2,5-Xylenol (74.4 g/48.8 g) (60/40) | Acrolein (62 g) | 170 | 4.0 | 0.9 |
| 12 | 2-Methylresorcinol/ m-Cresol/p-Cresol (37.2 g/45.4 g/ 30.2 g) (30/42/28) | Formalin (90 g) | 180 | 4.1 | 0.9 |
| 13 | 5-Chlororesorcinol/ p-Cresol (115.6 g/21.6 g) (80/20) | Formaline (90 g) | 140 | 3.8 | 0.9 |
| 14 | 5-Chlororesorcinol/ 3,5-Xylenol (43.4 g/85.4 g) | Acrolein (62 g) | 130 | 3.7 | 0.9 |

TABLE 1-continued

| Example No. | Phenol (I)/Phenol (II) (amount) (molar ratio) | Carbonyl compound (amount) | Heat-resistance temp. (°C.) | Dry-etching resistance (selc. ratio) | Resolution (μm) |
|---|---|---|---|---|---|
| 15 | 5-Chlororesorcinol (144.5 g) (30/70) | Acetaldehyde (54 g) | 130 | 3.5 | 0.9 |
| 16 | Phloroglucinol (126 g) | Acetone (70 g) | 140 | 3.9 | 0.9 |
| 17 | Pyrogallol (126 g) | Acetone (70 g) | 130 | 3.8 | 0.9 |
| 18 | 2-Methylresorcinol/ 2,3,5-Trimethyl-phenol (37.2 g/95.2 g) (30/70) | Formaline (90 g) | 190 | 4.0 | 0.8 |
| 19 | Resorcinol/m-Cresol/ 3,5-Xylenol (27.5 g/53.0 g/ 31.7 g) (25/49/26) | Acetaldehyde (70 g) | 130 | 3.6 | 0.8 |

EXAMPLES 20 to 22

The same procedure as in Example 1 was repeated, except that the compounds shown in Table 2 were substituted for the 1,2-quinonediazide compound to prepare solutions of Compositions A of this invention. The solutions were subjected to the same treatment as in Example 1 to form resist patterns, after which the heat-resistance temperatures, dry-etching resistances and resolutions of the resist patterns were determined in the same manner as in Example 1, to obtain the results shown in Table 2, from which it can be seen that all the resist patterns are high in heat-resistance temperature and excellent in dry-etching resistance and resolution.

TABLE 2

| Example No. | 1,2-Quinonediazide compound | Heat-resistance temp. (°C.) | Dry-etching resistance (selc. ratio) | Resolution (μm) |
|---|---|---|---|---|
| 20 | 2,2-Bis(2,3,4-trihydroxphenol)-propane-1,2-naphthoquinonediazide-5-sulfonic acid hexaester | 180 | 4.3 | 0.7 |
| 21 | Bis(2,3,4-trihydroxybenzoyl)-methane-1,2-naphthoquinonediazide-5-sulfonic acid hexaester | 160 | 3.9 | 0.7 |
| 22 | Ethylene glycol-di(3,5-dihydroxybenzoate)-1,2-naphthoquinonediazide-5-sulfonic acid triester | 170 | 4.1 | 0.8 |

EXAMPLE 23

(1) Into a 500-ml separable flask equipped with a stirrer, a dropping funnel and a thermometer were charged 11.2 g of 2,3,4,2',6'-pentahydroxybenzophenone and 34.5 g of 1,2-naphthoquinonediazide-5-sulfonic acid chloride (referred to hereinafter as NQD) in a molar ratio of 1:3, and further, to the resulting solution was added 240 g of dioxane, after which the resulting mixture was stirred to form a solution. Separately, 14.3 g of triethylamine was charged into the dropping funnel. The separable flask was immersed in a water bath adjusted to 30° C., and when the internal temperature reached a constant temperature of 30° C., the triethylamine was dropwise added to the solution so gradually that the internal temperature did not exceed 35° C. Subsequently, the triethylamine hydrochloride salt was removed by filtration, and the filtrate was poured into a large amount of dilute hydrochloric acid, upon which 2,3,4,2',6'-pentahydroxybenzophenone-1,2-naphthoquinonediazide-5-sulfonic acid triester was precipitated. The 1,2-quinonediazide compound recovered by filtration was dried a whole day and night in a vacuum-drier adjusted to 40° C. The yield was 98%.

(2) Into a 300-ml separable flask equipped with a stirrer charged 20 g of an alkali-soluble novolac resin produced by polycondensing a cresol mixture of m-cresol/ p-cresol (6/4 by mole) with formaline, 5 g of the above 2,3,4,2',6'-pentahydroxybenzophenone-1,2-naphthoquinonediazide- 5-sulfonic acid triester, 60 g of ethylcellosolve acetate and 15 g of γ-butyrolacetone, and the resulting mixture was well stirred at room temperature to form a solution. The solution thus formed was filtered through a membrane filter having a pore diameter of 0.2 μm to prepare a solution of the Composition B of this invention. This solution was spin-coated on a silicon wafer having a silicon oxide film by means of a spinner, and thereafter, pre-baked at 90° C. for 2 minutes to form a resist layer having a thickness of 1.2 μm.

Subsequently, the resist layer was exposed to light through a pattern mask using a stepper for 0.45 seconds, and then developed with a 2.2% by weight aqueous TMA solution for 60 seconds. The resist pattern thus obtained was observed by means of a scanning electron microscope to find that no undeveloped portion, namely no developing residue was recognized in the adhesion portion between the substrate and the resist pattern and that a resist pattern having a line width of 0.8 μm was resolved.

COMPARATIVE EXAMPLE 2

The same procedure as in Example 23 (2) was repeated, except that 2,3,4-trihydroxybenzophenone-1,2-naphthoquinonediazide-5-sulfonic acid triester was substituted for the 2,3,4,2',6'-pentahydroxybenzophenone-1,2-naphthoquinonediazide-5-sulfonic acid triester to prepare a solution of a resist composition. In the same manner as in Example 23 (2), this solution was applied to a silicon wafer having a silicon oxide film and then exposed to light for 65 seconds through a pattern mask using a stepper and thereafter developed with a 2.4% by weight aqueous TMA solution. The resist pattern thus obtained was observed by means of a scanning electron microscope to find that resolution was possible until a line width of 1.1 μm, but a developing residue was recognized in the portion at which the resist pattern contacted the substrate.

EXAMPLES 24 to 29

In the same manner as in Example 23 (1), 2,4,6,3',4',5'-hexahydroxybenzophenone, 2,3,4,5,4-pentahydroxybenzophenone or 2,3,4,3',4',5'-hexahydroxy-5-methylbenzophenone was reacted with NQD, triethylamine and dioxane to synthesize the 1,2-quinonediazide compounds shown in Table 3. Subsequently, the same procedure as in Example 23 (2) was repeated, except that these 1,2-quinonediazide compounds and an alkali-soluble novolac resin produced by polycondensing a cresol mixture of m-cresol/p-cresol (4/6 by mole) with formaldehyde were used to prepare solutions of the Compositions B. In the same manner as in Example 23 (2), the solutions thus obtained were applied to a silicon wafer having a silicon oxide film and exposed to light for the periods of time shown in Table 3 through a pattern mask using a stepper, and then developed with a 2.4% by weight aqueous TMA solution. The resist patterns thus obtained were observed by means of a scanning electron microscope to find that the resolutions of the resist patterns were high as shown in Table 3 and no developing residue was recognized.

TABLE 3

| Example No. | 1,2-Quinonediazide compound | Exposure time (sec) | Resolution (μm) |
|---|---|---|---|
| 24 | 2,4,6,3',4',5'-Hexahydroxy-benzophenone-1,2-naphtho-quinonediazide-5-sulfonic acid tetraester | 0.38 | 0.8 |
| 25 | 2,3,4,3',4',5'-Hexahydroxy-benzophenone-1,2-naphtho-quinonediazide-5-sulfonic acid tetraester | 0.42 | 0.8 |
| 26 | 2,3,4,5,4'-Pentahydroxy-benzaphenone-1,2-naphtho-quinonediazide-5-sulfonic acid triester | 0.55 | 0.9 |
| 27 | 2,3,4,3',4',5'-Hexahydroxy-5-methylbenzophenone-1,2-naphthoquinonediazide-5-sulfonic acid triester | 0.48 | 0.8 |
| 28 | 2,3,4,3',4',5'-Hexahydroxy-benzophenone-1,2-naphtho-quinonediazide-4-sulfonic acid tetraester | 0.60 | 0.9 |
| 29 | 2,3,4,3',4',5'-Hexahydroxy-5-methylbenzophenone-1,2-naphthoquinonediazide-5-sulfonic acid tetraester | 0.58 | 0.8 |

EXAMPLES 30 to 33

The same procedure as in Example 23 (2) was repeated, except that the alkali-soluble novolac resin obtained by polycondensing a cresol mixture of m-cresol/p-cresol (6/4 by mole) with formaline was replaced with the alkali-soluble novolac resins produced by polycondensing a cresol mixture shown in Table 4 with formaline, to prepare solutions of the Compositions B of this invention. In the same manner as in Example 23 (2), the solutions thus obtained were applied to a silicon wafer having a silicon oxide film and then exposed to light through a pattern mask for the period of time shown in Table 4 using a stepper, and then developed with a 2.4% by weight aqueous TMA solution. The resist patterns thus obtained were observed by means of a scanning electron microscope to find that the resolutions of the resist patterns were high as shown in Table 4, and no developing residue was recognized.

TABLE 4

| Example No. | Novolac resin (molar ratio of cresols charged) | Exposure time (sec) | Resolution (μm) |
|---|---|---|---|
| 30 | m-Cresol/p-Cresol (7/3) | 0.37 | 0.8 |
| 31 | m-Cresol/3,5-Xylenol (7/3) | 0.48 | 0.9 |
| 32 | m-Cresol/p-Cresol/2,2-Bis-(p-hydroxyphenylpropane) (6/2/2) | 0.55 | 0.9 |
| 33 | α-Naphthol/2,5-Xylenol (6/4) | 0.85 | 0.8 |

EXAMPLES 34 to 36

Into a 500-ml separable flask equipped with a stirrer, a dropping funnel and a thermometer were charged 2,3,4,3',4',5'-hexahydroxybenzophenone (referred to hereinafter as HHBP), NQD, triethylamine and dioxane in the amounts shown in Table 5 and subjected to reaction in the same manner as in Example 23 (1) to synthesize 1,2-quinonediazide compounds. Subsequently, the same procedure as in Example 23 (2) was repeated, except that the 1,2-quinonediazide compounds thus obtained and alkali-soluble novolac resins produced by polycondensing a cresol mixture of m-cresol/p-cresol (4/6 by mole) with formaline were used to prepare solutions of the Compositions B of this invention. In the same manner as in Example 23 (2), the solutions thus obtained were applied to a silicon wafer having a silicon oxide film and then exposed to light for the period of time shown in Table 5 through a pattern mask using a stepper, and then developed with an aqueous TMA solution having a concentration as shown in Table 5. The resist patterns thus obtained were observed by means of a scanning electron microscope to find that the resolutions of the resist patterns were high as shown in Table 5, and no developing residue was recognized.

TABLE 5

| Example No. | Composition of feed (g) | | | | NQD/HHBP (mole ratio) | TMA conc. (% by wt) | Exposure time (sec) | Resolution (μm) |
|---|---|---|---|---|---|---|---|---|
| | HHBP | NQD | Triethylamine | Dioxane | | | | |
| 34 | 13.6 | 32.8 | 13.6 | 240 | 2.5 | 2.0 | 0.45 | 0.8 |
| 35 | 10.4 | 35.1 | 14.5 | 240 | 3.5 | 2.2 | 0.40 | 0.8 |
| 36 | 8.4 | 36.5 | 15.1 | 240 | 4.5 | 2.6 | 0.57 | 0.8 |

What is claimed is:
1. A positive-working photoresist composition comprising, in admixture, as a binder, an alkali-soluble novolak resin and a photosensitive amount of at least one photosensitive compound represented by Formula (I):

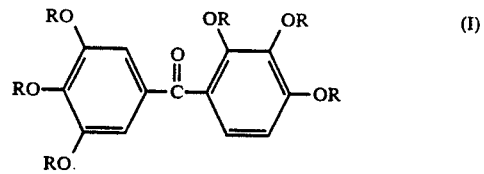

wherein at least one R group represents a 1,2-naphthoquinone diazido-4-sulfonyl group or a 1,2-naphthoquinone diazido-5-sulfonyl group, and the remaining R groups, which may be the same or different, each represents a hydrogen atom, a 1,2-naphthoquinone diazido-4-sulfonyl group, or a 1,2-naphthoquinone diazido-5-sulfonyl group, wherein said resin and photosensitive compound are employed in sufficient quantity amounts to enable a positive resist image to be obtained upon light pattern exposure and subsequent development.

* * * * *

UNITED STATES PATENT AND TRADEMARK OFFICE
CERTIFICATE OF CORRECTION

PATENT NO. : 5,087,548

DATED : February 11, 1992

INVENTOR(S) : Yoshihiro Hosaka et al.

It is certified that error appears in the above-identified patent and that said Letters Patent is hereby corrected as shown below:

ON THE TITLE PAGE

Item [73] Assignee should be --Japan Synthetic Rubber Co., Ltd.--.

Signed and Sealed this

Eighth Day of June, 1993

Attest:

MICHAEL K. KIRK

*Attesting Officer*     Acting Commissioner of Patents and Trademarks